United States Patent
Then et al.

(10) Patent No.: US 10,923,584 B2
(45) Date of Patent: Feb. 16, 2021

(54) GRADED CHANNELS FOR HIGH FREQUENCY III-N TRANSISTORS

(71) Applicant: INTEL CORPORATION, Santa Clara, CA (US)

(72) Inventors: Han Wui Then, Portland, OR (US); Sansaptak Dasgupta, Hillsborough, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 16/303,818

(22) PCT Filed: Jul. 1, 2016

(86) PCT No.: PCT/US2016/040790
§ 371 (c)(1),
(2) Date: Nov. 21, 2018

(87) PCT Pub. No.: WO2018/004674
PCT Pub. Date: Jan. 4, 2018

(65) Prior Publication Data
US 2020/0119175 A1  Apr. 16, 2020

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0254* (2013.01); *H01L 21/30625* (2013.01);
(Continued)

(58) Field of Classification Search
None
See application file for complete search history.

(56) References Cited

U.S. PATENT DOCUMENTS

2007/0045611 A1* 3/2007 Zhu .................. H01L 29/78696
257/20
2009/0050938 A1 2/2009 Miyoshi et al.
(Continued)

FOREIGN PATENT DOCUMENTS

JP 2014110320 A 6/2014
WO 2018004674 A1 1/2018

OTHER PUBLICATIONS

International Search Report and Written Opinion recieved for PCT Application No. PCT/US20161040790, dated Apr. 26, 2017. 13 pages.

(Continued)

*Primary Examiner* — Anthony Ho
*Assistant Examiner* — Kevin Quinto
(74) *Attorney, Agent, or Firm* — Schwabe, Williamson & Wyatt, P.C.

(57) ABSTRACT

Techniques are disclosed for forming III-N transistor structures that include a graded channel region. The disclosed transistors may be implemented with various III-N materials, such as gallium nitride (GaN) and the channel region may be graded with a gradient material that is a different III-N compound, such as indium gallium nitride (InGaN), in some embodiments. The grading of the channel region may provide, in some cases, a built in polarization field that may accelerate carriers travelling between the source and drain, thereby reducing transit time. In various embodiments where GaN is used as the semiconductor material for the transistor, the GaN may be epitaxially grown to expose either the c-plane or the m-plane of the crystal structure, which may further contribute to the built-in polarization field produced by the graded channel.

20 Claims, 9 Drawing Sheets

(51) Int. Cl.
*H01L 21/306* (2006.01)
*H01L 21/8252* (2006.01)
*H01L 27/088* (2006.01)
*H01L 29/04* (2006.01)
*H01L 29/08* (2006.01)
*H01L 29/10* (2006.01)
*H01L 29/20* (2006.01)
*H01L 29/205* (2006.01)
*H01L 29/66* (2006.01)

(52) U.S. Cl.
CPC ........ *H01L 21/8252* (2013.01); *H01L 27/088* (2013.01); *H01L 29/045* (2013.01); *H01L 29/0847* (2013.01); *H01L 29/1054* (2013.01); *H01L 29/2003* (2013.01); *H01L 29/205* (2013.01); *H01L 29/66462* (2013.01)

(56) References Cited

U.S. PATENT DOCUMENTS

| | | |
|---|---|---|
| 2011/0227090 A1 | 9/2011 | Briere |
| 2013/0221366 A1 | 8/2013 | Curatola et al. |
| 2014/0175515 A1* | 6/2014 | Then ............... H01L 29/772 |
| | | 257/194 |
| 2015/0064859 A1 | 3/2015 | Then et al. |

OTHER PUBLICATIONS

International Preliminary Report on Patentability recieved for PCT Application No. PCT/US2016/040790, dated Jan. 10, 2019. 12 pages.

"Heterojunction bipolar transistor," Wikipedia, originally retrieved from the Internet on Jul. 8, 2016. 3 pages.

* cited by examiner

GRADED CHANNELS FOR HIGH FREQUENCY III-N TRANSISTORS

BACKGROUND

Semiconductor devices, such as field effect transistors, may include a channel region located beneath the gate, connecting the source and drain. When in operation, carriers (e.g., electrons for n-type metal oxide or NMOS devices, and hole for p-type metal oxide or PMOS devices) may travel through the channel region between the source and drain.

BRIEF DESCRIPTION OF THE DRAWINGS

FIG. 1A shows an example c-plane III-N transistor and FIG. 1B shows an example m-plane III-N transistor, in accordance with various embodiments disclosed herein.

Figure 1A:
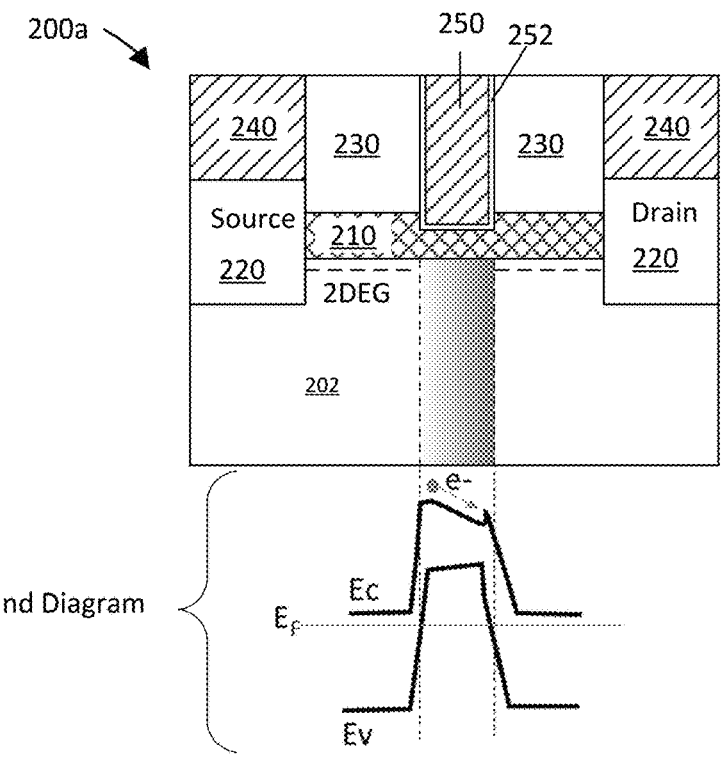
FIG. 1A and FIG. 1B illustrate cross-section views of example III-N transistors, each having a graded channel, in accordance with one or more embodiments of the present disclosure. Particularly.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming semiconductor structures that include a graded channel region. Specifically, the described techniques provide for forming transistors implemented with group III-N semiconductor materials such as gallium nitride (GaN), indium nitride (InN), aluminum nitride (AlN), and compounds thereof, referred to herein generally as "III-N transistors." The disclosed III-N transistors have a channel region that is graded. For example, in some embodiments, the disclosed graded channel regions may be graded with a first III-N material (e.g., GaN) and a second III-N material (e.g., InGaN). In some embodiments, the content of the second III-N material starts at a low percentage (or 0%) and is increased to a higher percentage. So, for instance, a first III-N material of GaN can be graded or transitioned into a second material of InGaN by increasing the indium concentration from 0% to some target percentage (e.g., 5% or 15%). In other embodiments, rather than gradually increasing the content of the second III-N material across the channel region, the graded channel may be formed by inserting a distinct layer comprising mostly or entirely the second III-N material in a portion of the channel region.

The disclosed graded channel regions may provide numerous benefits when included in III-N transistors. For example, III-N transistors having a graded channel region according to some embodiments may be able to achieve higher cut-off frequency (fT, the frequency where the gain of the transistor equals unity) as compared to III-N transistors having non-graded channel regions. Additionally, III-N transistors having graded channel regions as disclosed herein may be capable of exceeding 450 GHz fT over a broader range of channel lengths, such as along a channel length of 20 nm or 30 nm or higher. In some embodiments, the disclosed III-N transistors with graded channel regions may be scaled to provide a fT approaching 1000 Gz or 1 THz. In addition to other advantages, the disclosed III-N transistors having graded channel regions may also be operated with drain voltages that are compatible with mobile computing device batteries (e.g., less than 6V). Numerous other configurations and variations will be apparent in light of this disclosure.

General Overview

Conventional III-N transistors do not employ a graded channel. In contrast, and in accordance with an embodiment of the present disclosure, a transistor implemented with III-N materials is configured with a graded channel. The channel exhibits a built-in polarization field that may be used to accelerate carriers (e.g., electrons) in the channel to achieve higher velocities, relative to conventional transistors. While GaN has been shown to have a higher saturation velocity (vsat) than any other group III-V or group IV semiconductor material, the saturation velocity of GaN previously could not be achieved by scaling of conventional GaN transistors alone. However, graded channels as disclosed herein can be used to capitalize on the vsat of GaN and other III-N materials, resulting in transistors having very high cut-off frequencies. As will be further appreciated in light of this disclosure, the disclosed III-N transistors are able to utilize the built-in crystal polarization field to accelerate carriers from source to drain, without the need for dopant impurities to be introduced as required by group IV transistors, thereby preserving high carrier mobility. In addition, III-N transistors having a graded channel as variously described herein are not limited to short channel lengths and exhibit no or negligible drain-gate parasitic leakage and capacitance.

As used herein, the term "graded channel" or "graded channel region" generally refers to a region beneath the gate between the source and drain regions through which carriers travel between source and drain. Such a graded channel is graded at least in a direction parallel to the substrate surface (e.g., along the direction of carrier movement from source to drain). Travelling in a direction parallel to the substrate surface from source to drain, a graded channel region may gradually or suddenly increase or decrease in concentration of a particular III-N material that is distinct from other III-N material present in the channel. For example, in some embodiments, the graded channel region may have an initial concentration of a first III-N material that is approximately 100% and an initial concentration of a second III-N material that is approximately 0% and along the length of the channel, the concentration of the first III-N material may decrease to a concentration within the range of 70% to 95% and the concentration of the second III-N material may increase to a concentration within the range of 30% to 5%. In some embodiments, the first III-N material is GaN and the second III-N material is InGaN and the indium concentration varies across the length of the graded channel by at least 5%. As used herein, all percentages refer to molar percentages, unless otherwise indicated. For example, a material of region having a 5% (molar) indium content means that for every 100 atoms or molecules within the material or region, 5 atoms are indium.

From a structural viewpoint, the disclosed graded channels as provided herein may include various cross-sectional profiles. For example, in some embodiments, the graded channel may be implemented with GaN that is graded with InGaN. The indium present in such embodiments may be gradually introduced, resulting in a cross-sectional profile gradient of indium content across at least part of the channel length, as that channel travels in a source to drain direction. For example, in some such embodiments, the indium concentration may be approximately 0% at a first point and at a second point may be within the range of 20%. In other embodiments, the graded channel may be formed of GaN and may include indium in a step-wise manner. For example, three layers could be used to form the graded channel and the first layer could include a first percentage of indium, the second layer could include a percentage of indium greater than the first layer, and the third layer could include a percentage of indium greater than the second layer. In some such embodiments, for example, the first layer may include 5% indium, the second layer may include 15% indium, and the third layer may include 25% indium. In still other embodiments, a graded channel may be formed to have at least two distinct regions of III-N materials and need not include a gradual increase or decrease in III-N materials between the two distinct regions. Note that such a configuration still provides a graded channel in a step-wise manner, but the step resolution or grading used to get to the target concentration levels is coarser, as may be appreciated. For example, in some such embodiments, a graded channel may include a first region having approximately 100% GaN and 0% InGaN and this region may abut a second region having approximately a 100% concentration of InGaN and a 0% concentration of GaN. Thus, the step-wise transition from no indium to the target concentration of indium is done in one step, rather than a series of steps. While these examples discussed in detail identify GaN as the first III-N material and InGaN as the second III-N material present in the graded channel region for ease of illustration, it is important to note that any other suitable III-N materials may be used in alternative embodiments, as will be appreciated.

In some III-N materials, the atoms of the material are arranged in a crystal structure. For example, the gallium and nitrogen atoms of gallium nitride (GaN) assemble in a Wurtzite crystal structure. The crystal structure of GaN has various planes, including a c-plane and an m-plane that is perpendicular to the c-plane. For some III-N materials, such as GaN, different planes of the material may have different polarity as the atoms that are exposed varies based on the plane selected. For example, the c-plane of GaN may be more polar than the m-plane of GaN. In various example III-N transistors implemented with GaN, the GaN present in the semiconductor layer may be positioned to expose either a c-plane or an m-plane of the crystal structure at a surface of the semiconductor layer.

Further note that, in some embodiments, channel grading as provided herein increases a III-N component as the channel region travels in the source to drain direction. In other embodiments, note that the disclosed channel regions may be graded to increase a III-N component as the channel region travels in the drain to source direction. In any such cases, further note that the gradient material (e.g., the second III-N material, and in some cases, InGaN) present in the channel may be closer to the source or may be closer to the drain, depending on the desired application. For example, in some embodiments, the disclosed channels may be graded such that the gradient material is positioned in a region closer to the drain. In some such example embodiments, the gradient material content (e.g., the percent of indium present in some embodiments where indium is the gradient material) may increase from approximately 0% in a region closer to the source to a percentage of approximately 30% at a region closer to the drain. In other embodiments, the disclosed channels may be graded such that the gradient material is positioned in a region closer to the source. For example, in some such embodiments, the gradient material content in a region closer to the source may be approximately 30% while in a region closer to the drain the gradient material content may be approximately 0%.

In particular embodiments, a c-plane and/or an m-plane III-N material may be epitaxially grown on a substrate. In some embodiments, a c-plane III-N material may be grown on an upwardly facing surface of a substrate and/or an m-plane material may be grown on a surface of the substrate that is positioned 90° from the upwardly facing surface of the substrate. The disclosed III-N transistors may be formed on a substrate, including group IV semiconductor materials such as silicon (Si), silicon carbide, sapphire, germanium (Ge), and/or silicon germanium (SiGe). Numerous configurations will be apparent in light of the present disclosure.

As used herein, group III-N semiconductor material (or III-N material or simply III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN), to name a few examples of III-N materials. In a more inclusive manner, note that a group III-V material, as used herein, includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Numerous group III-V material systems can be used to implement a graded channel as provided here in various embodiments of the present disclosure.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name some suitable example analytical tools. In some embodiments, for instance, a SEM may indicate a graded channel layer, having at least one component of a channel III-V compound graded in a direction parallel to the source-drain direction. Numerous configurations and variations will be apparent in light of this disclosure.

The semiconductor structures variously described herein may be suitable for numerous applications, such as the personal computers (PC), tablet computers, smartphones, power management and communication applications, as well as power conversion and automotive applications, to name a few examples. The structure may be included in an integrated circuit chip or chip set, such as a system-on-chip (SOC). Numerous configurations and variations will be apparent in light of this disclosure.

Architecture and Methodology

Figure 1B:
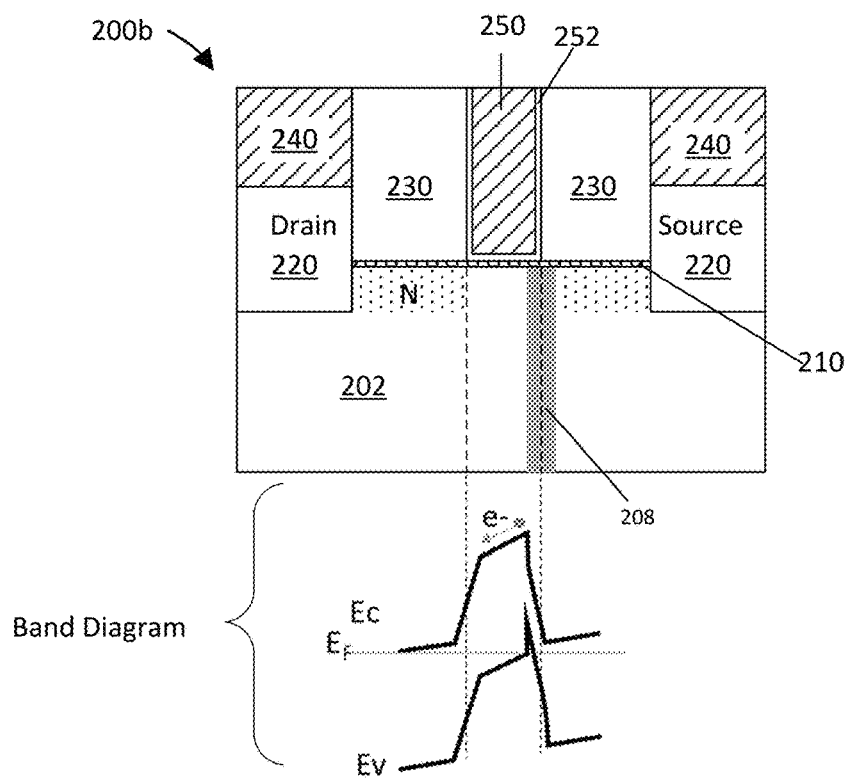

FIGS. 1A and 1B illustrate example III-N transistors 200*a* and 200*b*, each having a graded channel. In particular, FIG. 1A shows an example transistor 200*a* that includes c-plane III-N material and FIG. 1B shows an example transistor 200*b* that includes m-plane III-N material. The example III-N transistors 200*a*, 200*b* shown in FIGS. 1A and 1B each include a III-N layer 202, a polarization layer 210 formed on III-N layer 202, a gate 250, an optional gate dielectric 260, spacers 230 positioned on either side of gate 250, source and drain regions 220, source and drain contacts 240 and a graded channel region located beneath gate 250 between source/drain regions 220. III-N transistor 200*a* shown in FIG. 1A includes two-dimensional electron gas (2DEG) architecture and the III-N transistor 200*b* shown in FIG. 1B includes tips formed of implanted dopant. For consistency and ease of understanding in the present disclosure, III-N transistors 200*a-b* hereinafter may be collectively referred to generally as III-N transistors 200, except where separately referenced.

As can be seen in FIG. 1A, the graded channel region of III-N transistor 200*a* includes a first type of III-N material (shown with no shading) and a second type of III-N material (shown with shading) that is gradually increased along the channel length from source to drain. In particular, the second type of III-N material, the gradient material, is more highly concentrated at a region of the channel closer to the drain than the source. In contrast, the graded channel of III-N transistor 200*b* is formed almost exclusively of a first III-N material (shown without shading) and includes only a small region of a second III-N material (shown with shading). The region of the first III-N material and the region of the second III-N material are distinct and there are no transitional regions that include both the first type of III-N material and the second type of III-N material in the graded channel of III-N transistor 200*b*.

III-N transistors 200*a* and 200*b* may be implemented with gallium nitride (GaN). Specifically, III-N transistor 200*a* may include c-plane GaN and III-N transistor 200*b* may include m-plane GaN. As previously explained, the polarity of the III-N material may vary depending on the face of the crystal structure that is exposed. Additionally, in embodiments where III-N transistors 200 are implemented with GaN, the crystal structure of the GaN may provide a built-in polarization field for the disclosed III-N transistors 200. For example, in embodiments as shown in FIG. 1A where the III-N layer 202 comprises c-plane GaN, the built-in polarization field may be vertical. In other embodiments, such as the structure shown in FIG. 1B where the III-N layer 202 comprises m-plane GaN, the built-in polarization field of the III-N material may be horizontal. Differences in the polarization field of the III-N material may allow for different channel grading schemes to be used.

Energy band diagrams for the channel regions of III-N transistor 200*a* and 200*b* are shown in FIGS. 1A and B. The valence band edge is identified with "$E_v$", the conduction band edge is identified as "$E_c$" and the Fermi level is identified as "$E_f$" in FIGS. 1A and B. As illustrated, the graded channel regions of the III-N transistors provide for decreased electrical potential energy as a carrier travels from source to drain. Thus, the graded channel regions of the disclosed III-N transistors may provide for higher electron velocity, which may result in decreased transit time. Additionally, the band diagram of III-N transistor 200*a*, shown in FIG. 1A, also includes a spike in energy in a region of the channel close to the drain. This spike in energy indicates that at the drain of the disclosed III-N transistor 200*a*, the maximum voltage the transistor can accommodate in the drain increases. Numerous other features and advantages of the presently disclosed III-N transistors are described in detail herein.

C-Plane Embodiments

Figure 2:
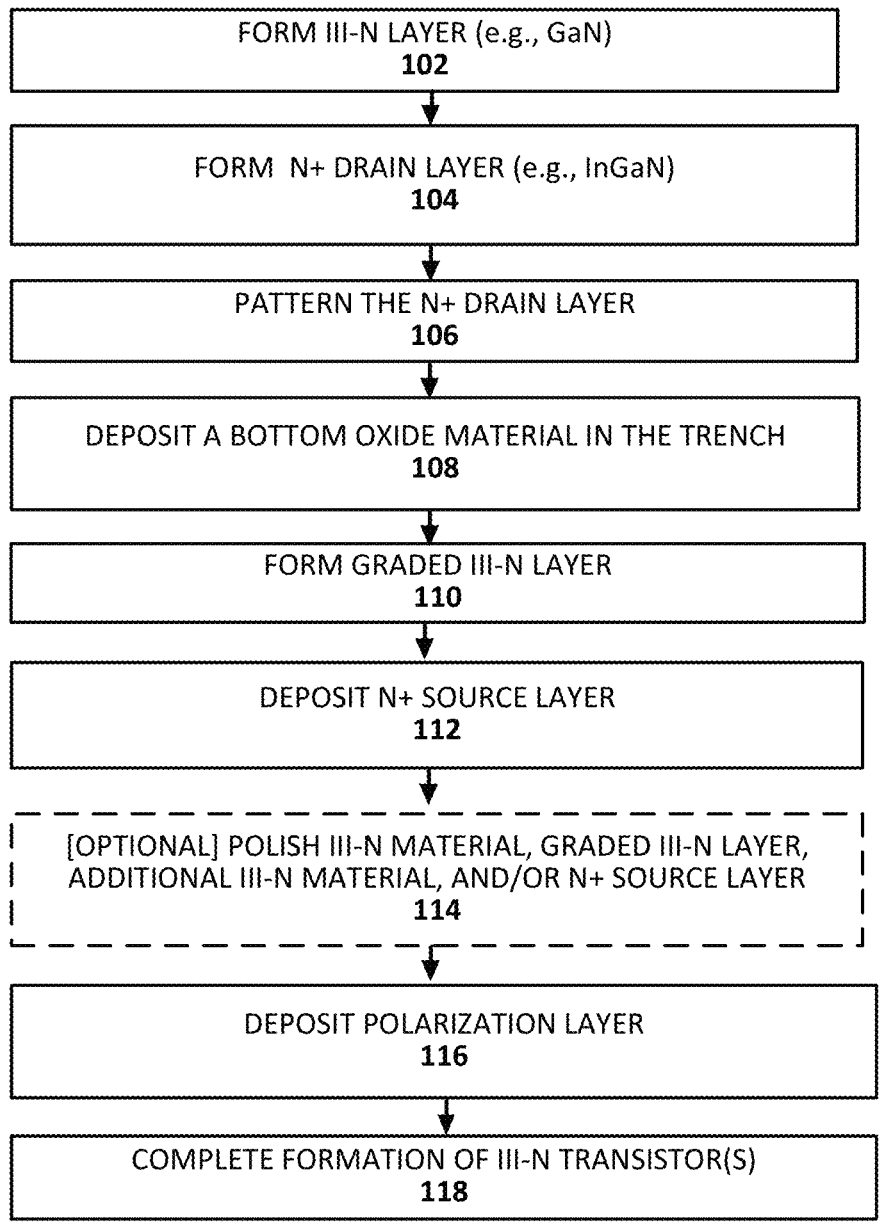
FIG. 2 illustrates an example methodology for producing a c-plane III-N transistor having a graded channel, in accordance with one or more embodiments of the present disclosure.

FIG. 2 illustrates a method 100 of forming a III-N transistor 200*a* having a graded channel in accordance with one or more embodiments of the present disclosure. In these and other embodiments, the III-N material used to implement the transistor may be oriented such that the c-plane of the material is exposed to vertically adjacent layers. FIGS. 4A-4F illustrate example structures that may be formed when carrying out method 100 of FIG. 2, in accordance with some embodiments. As will be apparent in light of the structures formed in FIGS. 4A-4F, method 100 discloses techniques for forming one or more III-N transistors 200*a* having a graded channel. Various transistor geometries can be formed using the techniques described herein, including, but not limited to, field effect transistors (FETs) for both logic switching and power switching, high-electron-mobility transistors (HEMTs), pseudomorphic high-electron-mobility transistors (pHEMT), transistors employing 2DEG architecture, transistors employing 3DEG (or 3D polarization FET) architecture, and transistors employing multiple quantum-wells (MQW) or super-lattice architecture.

Figure 4A:
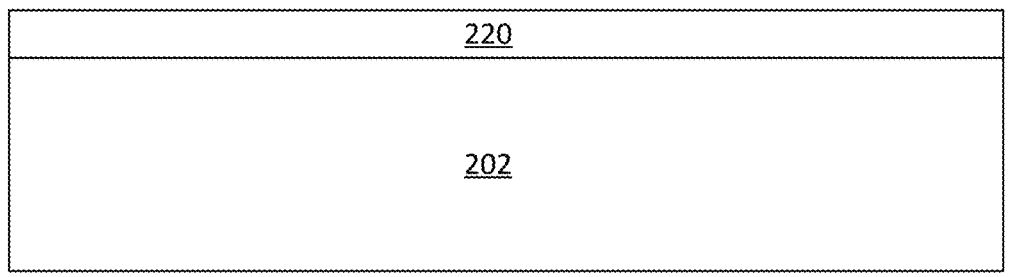
FIGS. 4A-4F illustrate cross-section side views of a series of integrated circuit structures that may be formed when carrying out the method of FIG. 2, in accordance with various embodiments of the present disclosure.

As shown in FIG. 2, method 100 includes forming 102 a III-N layer 202 and forming 104 an N+ drain layer to produce a structure as shown in FIG. 4A, in accordance with an example embodiment. The III-N layer 202 may comprise gallium nitride (GaN), but other III-N materials may be used as well, such as aluminum nitride (AlN) or indium nitride (InN). In some embodiments, the III-N layer 202 comprises at least 50%, at least 60%, at least 70%, at least 80%, at least 90%, at least 95%, or 100% GaN. In some embodiments, the III-N layer 202 may be at least 1 micron in thickness (e.g., approximately 1 micron high when deposited) or less, or any other suitable thickness, although the thickness can vary from one embodiment to the next as will be appreciated in light of this disclosure. In some embodiments where the III-N layer 202 is implemented with GaN, the GaN may be epitaxially grown to expose a particular plane of the structure. For example, in some embodiments, III-N layer 202 may be formed to expose the c-plane of the GaN crystal structure. The N+ drain layer 220 may be formed using any suitable material, including a III-N compound, such N+ gallium nitride or N+ indium gallium nitride. For example, in some particular embodiments, N+ drain layer 220 may comprise indium gallium nitride (InGaN) having an indium concentration of between 5% and 20%. III-N layer 202 and/or N+ drain layer 220 may be epitaxially grown, such as by liquid phase epitaxy (LPE), metal-organic chemical vapor deposition (MOCVD), molecular beam epitaxy (MBE), or any other suitable deposition process. In some embodiments, growth conditions may be adjusted based on the desired resulting characteristics of the layer(s).

Figure 4B:
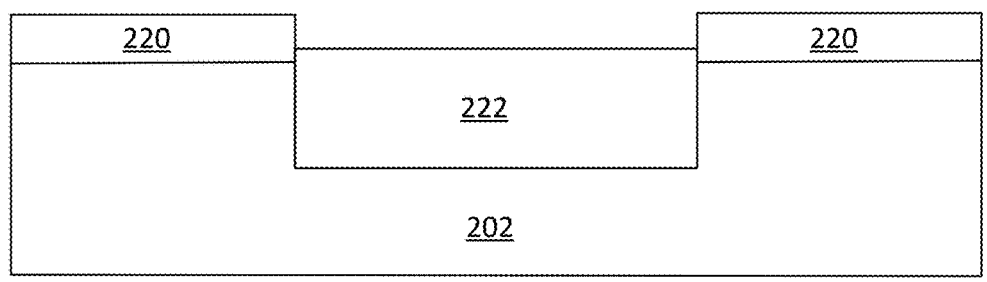

Method 100 of FIG. 2 continues with patterning 106 the N+ drain layer 220 and the III-N layer 202 and depositing 108 a bottom oxide material 222 to form a structure as shown in FIG. 4B, in accordance with an example embodiment. In addition to patterning 106 N+ drain layer 220, III-N layer 202 may also be patterned, as needed. For example, III-N layer 202 may be patterned as shown in FIG. 4B. N+ drain layer 220 and/or III-N layer 202 may be patterned by any suitable technique, including by masking, lithography and etching (wet and/or dry) processes. While the structure shown in FIG. 4B includes a trench and fins of specific dimensions, III-N layer 202 and N+ drain layer 220 can be patterned to have trenches and fins of varying widths and heights, depending on the end use or target application. Similarly, although the structure in FIG. 4B is shown with one trench, any number of trenches may be formed, such as one, greater than one, two, ten, hundreds, thousands, millions, etc., depending on the end use or target application. Bottom oxide material 222 may be deposited 108 by any suitable technique, such as by chemical vapor deposition (CVD), atomic layer deposition (ALD), physical vapor deposition (PVD), or any other appropriate process. Bottom oxide material 222 may comprise any suitable insulating material, such as one or more oxides (e.g., silicon dioxide) and/or nitrides (e.g., silicon nitride). The bottom oxide material 222 may optionally be polished and/or recessed to form a structure as shown in FIG. 4B, in accordance with some example embodiments. In particular, FIG. 4B illustrates that bottom oxide material 222 may be recessed to expose a sidewall of N+ drain layer 220. Various processes can be used to recess the bottom oxide material 222 to expose the sidewall of the N+ drain layer 220, including wet etch techniques.

Figure 4C:
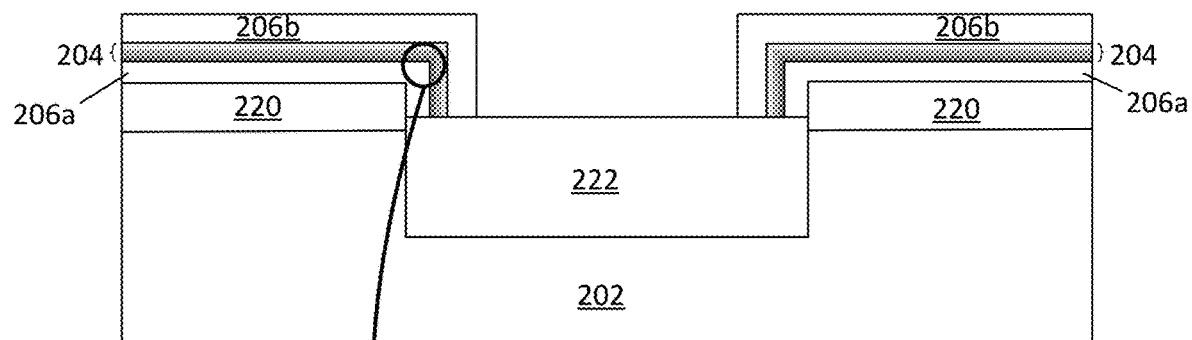
Figure 4C:
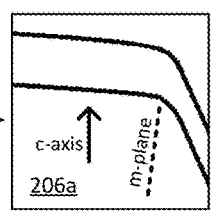

Method 100 of FIG. 2 continues with forming 110 a graded III-N layer 204 to produce a structure as shown in FIG. 4C, in accordance with an example embodiment. As shown in FIG. 4C, graded III-N layer 204 may include at least two distinct III-N materials. For example, in some embodiments, graded III-N layer 204 includes at least GaN and indium gallium nitride (InGaN). In FIG. 4C, graded III-N layer 204 is illustrated with no shading representing a first III-N material (e.g., GaN) and shading representing a second III-N material (e.g., InGaN). In FIG. 4C, darker shaded regions indicate a higher concentration of the second III-N material. Although FIG. 4C illustrates graded III-N layer 204 as having the second III-N material positioned inside the first III-N material, graded III-N layer 204 may alternatively be formed with the first III-N material positioned inside the second III-N material. Additional III-N layer(s) 206 may optionally be positioned underneath and/or over graded III-N layer 204, as illustrated in the embodiment shown in FIG. 4C. In some embodiments, additional III-N layer 206 may be formed of the first III-N material. The structure shown in FIG. 4C includes an additional III-N layer 206a positioned underneath graded III-N layer 204 and an additional III-N layer 206b positioned above graded III-N layer 204. In some particular embodiments, additional III-N layer 206a and/or 206b may be formed of the first III-N material (e.g., GaN). Graded III-N layer 204 may be formed by any suitable technique. For example, in some embodiments, III-N layer 204 may be epitaxially grown on one or more exposed faces of N+ drain layer 220. For example, where a horizontal and a vertical face of the N+ drain region are exposed, as shown in FIG. 4B, graded III-N layer 204 may be epitaxially grown on both the exposed horizontal face and the exposed vertical face of the N+ drain region 220.

FIG. 4C' illustrates a close-up illustration of additional III-N layer 206a and graded III-N layer 204. In particular, FIG. 4C' shows possible real-world structural features that may be present in a III-N transistor 200a formed by the disclosed methods. Specifically, the additional III-N layer 206a may have a horizontal top surface and a vertical sidewall that may not be positioned precisely perpendicular to one another, in some example embodiments. FIG. 4C' shows that graded III-N layer 204 may be formed to have similar relative angles of horizontal top surface to vertical sidewall. Additionally, depending on the formation method utilized, graded III-N layer 204 may be formed such that more material is deposited on the top surface of additional III-N layer 206a than on its sidewall. Numerous configurations will be apparent in light of this disclosure.

Graded channel 204 may be formed to have an initial concentration at one end of the channel of a first III-N material that is at least 95% and an initial concentration of a second III-N material at this end of the channel that is less than 5% and in some cases is 0%. Along the length of the channel, the concentration of the first III-N material and/or the second III-N material may change. For example, in some embodiments, at the end of the channel, the concentration of the first III-N material may be within the range of 70% to 90% and the concentration of the second III-N material may be within the range of 5% to 30%. In some particular embodiments, the first III-N material may be gallium nitride (GaN) and the second III-N material may be indium nitride (InN). In these and other embodiments, the graded channel 204 may be formed to have an indium concentration of less than 5% in a first region of the channel and in a second region of the channel closer to the source than the first region of the channel, the concentration of indium may be between 5% and 30%, such as between 10 and 20% in some embodiments.

Figure 4D:
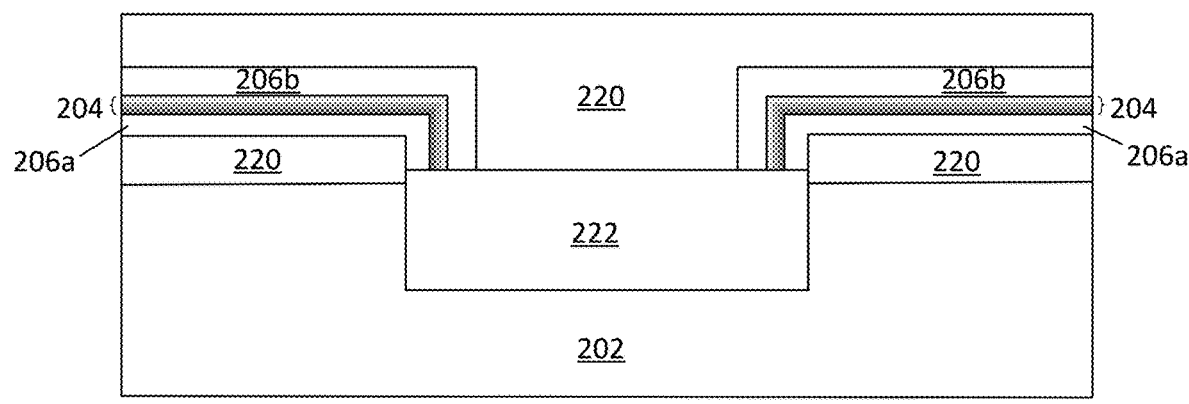

Method 100 of FIG. 2 continues with depositing 112 an N+ source layer 220 to form a structure as shown in FIG. 4D, in accordance with an example embodiment. N+ source layer 220 may be implemented with various materials, including III-N materials, such as N+ GaN or N+ InGaN. In some particular embodiments, N+ source layer 220 may comprise N+ indium gallium nitride (InGaN) having an indium concentration of between 5%-20%. The S/D material in the N+ source and/or N+ drain layers 220 may be doped prior to deposition, during deposition (in situ), or after deposition (ion implantation) to provide the desired polarity of p-type or n-type. The doping may be graded within the deposited S/D material, in some embodiments. In some specific embodiments, the III-N layer 202 is a GaN layer and the S/D material of the N+ source and N+ drain layers may be, for example, indium gallium nitride (InGaN) doped with Si to form n-type S/D regions. In still other such example embodiments, the S/D material may be n-type gallium nitride, n-type indium gallium nitride with a graded indium composition, or any other suitable S/D material as will be apparent in light of the present disclosure. After the S/D regions 220 are formed in the GaN or other suitable III-N layer 202, various other features such as spacer layer, barrier layers, gate stack, and contacts can subsequently be added as will be discussed in turn.

Figure 4E:
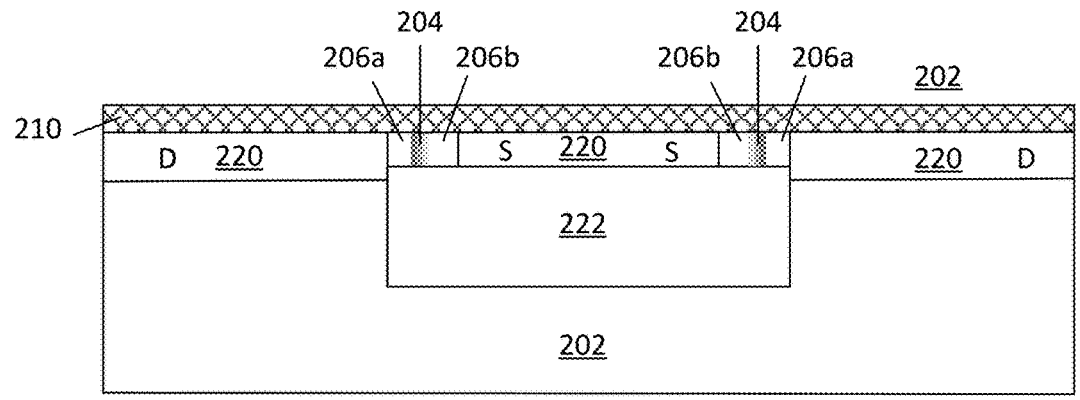

Method 100 of FIG. 2 continues with optionally planarizing 114 or otherwise polishing the graded III-N layer 204, additional III-N layer(s) 206 (if present), and/or the N+ source layer 220 of the semiconductor structure and depositing 116 polarization layer 210 to form a structure as shown in FIG. 4E, in accordance with an embodiment. In embodiments where a planarization process is employed, the structure may be planarized to remove the portions of any layers higher than the N+ source and N+ drain layers 220 (e.g., in the embodiment shown in FIG. 4D, at least a portion of graded III-N layer 204 may be removed along with a portion of additional III-N layers 206 and at least a portion of N+ source layer 220 to yield the underlying structure shown in FIG. 4E). Polarization layer 210 may be epitaxially grown or otherwise deposited to form a structure as shown in FIG. 4E, in accordance with some example embodiments. Polarization layer 210 may comprise a wide band-gap III-N material, such as, for example, aluminum nitride (AlN), aluminum gallium nitride (AlGaN), indium aluminum nitride (InAlN), indium aluminum gallium nitride (InAlGaN), any mixture thereof, or any other suitable material, as will be apparent in light of this disclosure. In some embodiments, the polarization layer 210 may be less than 50 nm in thickness, such as approximately 20-30 nm, or any other suitable thickness depending on end use or target application.

Figure 4F:
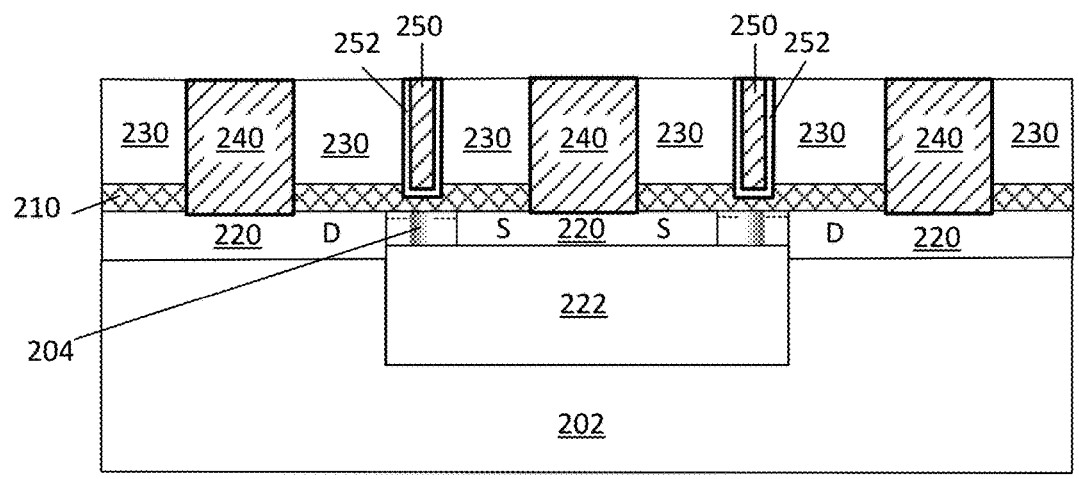

Method 100 of FIG. 2 continues with completing 118 formation of the III-N transistor(s) 200 to form a structure as illustrated in FIG. 4F, in accordance with an example embodiment. Completing 118 formation of the III-N transistor(s) 200 may involve forming a gate stack that may include a gate electrode 250 and may also optionally include a gate dielectric 252, both shown in FIG. 4F. Various MOSFET processing techniques may be used to complete formation of the III-N transistor 200. A gate electrode 250 and gate dielectric 252, if present, may be formed using any suitable technique and the layers may be formed from any suitable materials. The gate dielectric can be, for example, any suitable oxide, such as $SiO_2$ or high-k gate dielectric materials. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Gate electrode 250 may comprise a wide range of materials, such as polysilicon or various suitable metals or metal alloys, such as aluminum (Al), tungsten (W), titanium (Ti), tantalum (Ta), copper (Cu), titanium nitride (TiN), or tantalum nitride, for example. As shown in FIG. 4F, spacers 230 may also be formed on either side of the gate stack to complete 118 formation of the III-N transistor 200a. Spacers 230 may be formed of any suitable spacer material, including silicon nitride or silicon dioxide, or any other gate spacer material. Completing 118 formation of the III-N transistor(s) 200a may also include other processes, such as contact formation and/or back-end processing. For example, contacts 240 may be formed in the S/D regions using, for example, a silicidation process (generally, deposition of contact metal and subsequent annealing). Example materials used to form S/D contacts 240 include but are not limited to tungsten, titanium, silver, gold, aluminum and alloys thereof. Numerous variations on method 100 will be apparent in light of the present disclosure.

As previously noted, the channel region of III-N transistor 200a may be a 2DEG configuration, although other channel configurations can be used as well. For example, one or more additional III-N layers may optionally be deposited over polarization layer 210. As will be appreciated in light of this disclosure, if present, the one or more additional III-N layers may be utilized in conjunction with III-N layer 202 to form multiple quantum-well (MQW) or super-lattice transistor structures, 3D polarization FETs, or 3DEG transistors. For example, in some embodiments one or more additional sets of 2DEG layers (e.g., a GaN layer and a polarization layer) can be deposited over the III-N layer 202 and polarization layer 210. In some embodiments, one set, five sets, 10 sets, 100 sets, etc. of 2DEG layers could be formed. As will be appreciated in light of this disclosure, the disclosed methods and other methods of producing III-N transistor 200a may be particularly well-suited for commercial applications as devices may be formed on both sides of a trench, as illustrated in FIG. 4F, in accordance with some example embodiments.

M-Plane Embodiments

Figure 3:
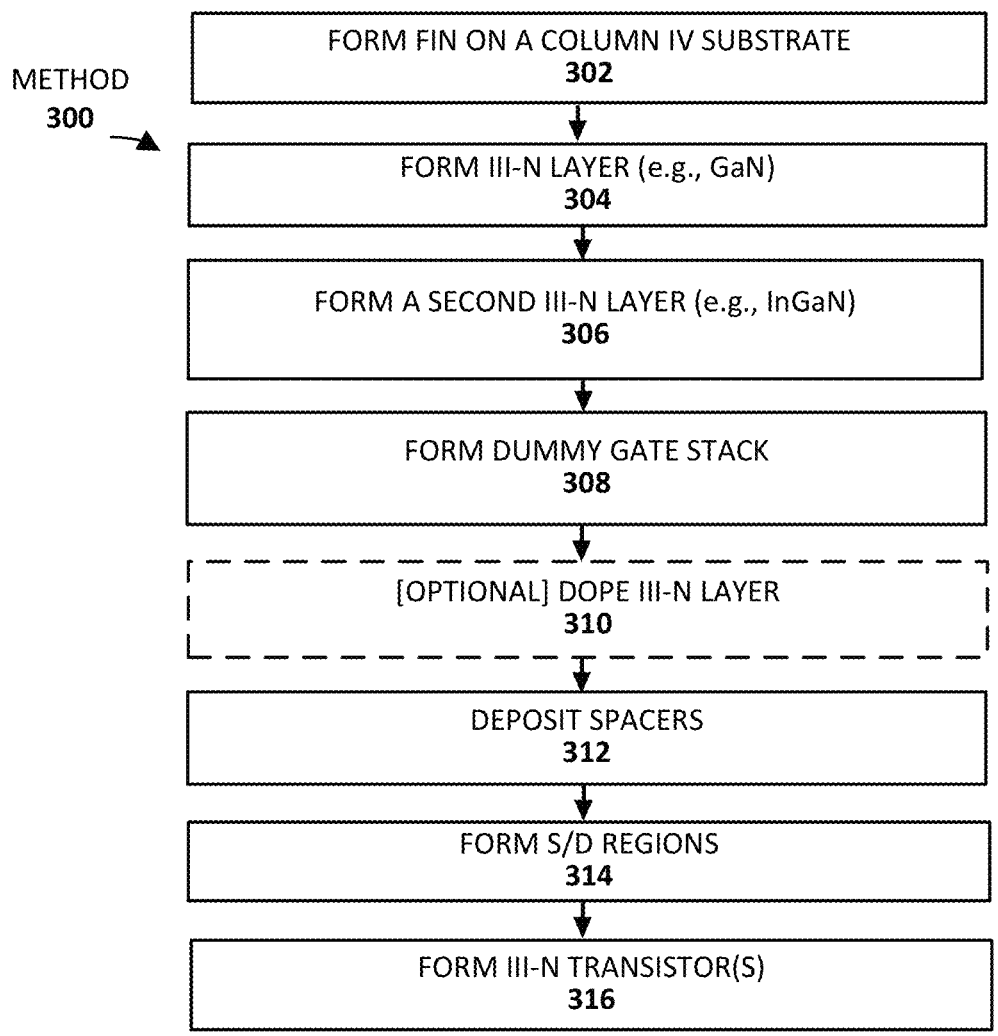
FIG. 3 illustrates an example methodology for producing an m-plane III-N transistor having a graded channel, in accordance with one or more embodiments of the present disclosure

FIG. 3 illustrates a method 300 of forming a III-N transistor 200b having a graded channel in accordance with one or more embodiments of the present disclosure. FIGS. 5A-5H illustrate example structures that may be formed when carrying out method 300 of FIG. 3, in accordance with some embodiments. As will be apparent in light of the structures formed in FIGS. 5A-5H, method 300 discloses techniques for forming one or more III-N transistors 200b having a graded channel region.

Figure 5A:
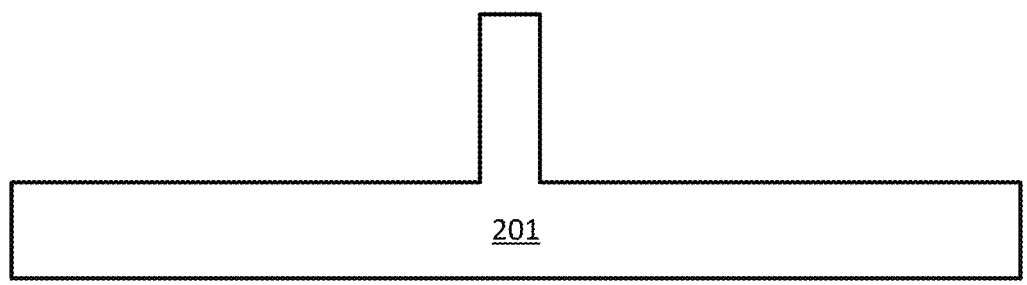
FIG. 5A-5H illustrate cross-section side views of a series of integrated circuit structures that may be formed when carrying out the method of FIG. 3, in accordance with various embodiments of the present disclosure.

As shown in FIG. 3, method 300 includes forming 302 at least one fin on a group IV substrate 201 to form a structure as shown in FIG. 5A, in accordance with an example embodiment. Any suitable group IV material may be used to form substrate 201. For example, substrate 201 may be implemented with $SiO_2$ in some embodiments. One or more fins may be formed 302 from substrate 201 by any suitable technique, such as one or more of the following processes: wet etching, dry etching, lithography, masking, patterning, exposing, developing, resist spinning, or any other suitable process(es). Although FIG. 5A illustrates substrate 201 as having a single fin, any number of fins may be formed from substrate 201. For example, one fin, two fins, twenty fins, fifty fins, one hundred fins, one thousand fins, one million fins or more may be formed from substrate 201. In some cases, the fins formed in substrate 201 may have approximately equal or equal dimensions, while in other cases, some of the fins may be formed to have different dimensions, depending on end use or target application. Various different fin geometries will be apparent in light of this disclosure.

Figure 5B:
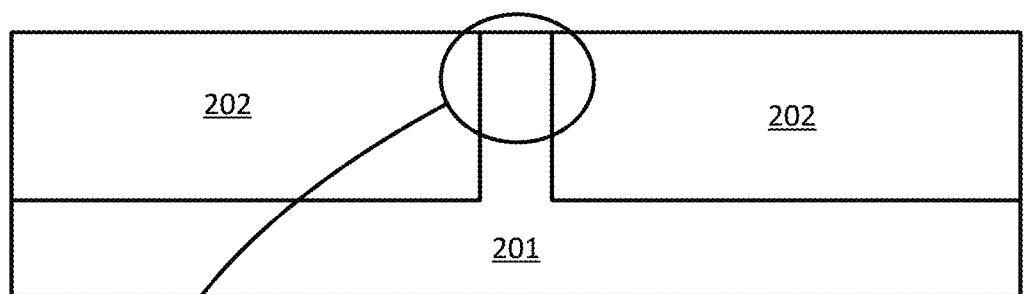
Figure 5B:

Method 300 of FIG. 3 continues with forming 304 III-N layer 202 to produce a structure as shown in FIG. 5B, in accordance with an example embodiment. III-N layer 202 may be formed of any material described above with respect to III-N layer 202 of method 100. In particular, in some embodiments III-N layer 202 is formed with gallium nitride (GaN). III-N layer 202 may be formed 304 by any suitable process, including epitaxial growth on one or more exposed surfaces of substrate 201. For example, in some embodiments, III-N layer 202 may be grown on an approximately vertical sidewall surface of substrate 201. In some such embodiments, the resulting III-N layer 202 may be oriented such that the m-plane of the crystal structure of III-N layer 202 is exposed.

FIG. 5B' shows a close-up illustration of an example fin of substrate 201 and III-N layer 202 grown therefrom. As will be appreciated in light of this disclosure, III-N layer 202 may be grown from an approximately vertical sidewall of substrate 201. In some such embodiments, the resulting structure may appear as in FIG. 5B'. For example, the sidewalls of substrate 201 may be slightly sloped as opposed to completely vertical, as illustrated in FIG. 5B'. Even in embodiments where substrate 201 includes a fin having an approximately vertical and linear sidewall, after formation of III-N layer 202, the fin of substrate 201 may be non-linear, as shown in FIG. 5B'. For example, during growth of III-N layer 202 the dimensions of substrate 201 may be altered, such as by reflow at high temperatures used to grow III-N layer 202, which may result in a substrate 201 having a sloped or otherwise non-linear fin. Reaction conditions, such as temperature and carrier gases, may be selected to maintain or alter the geometry of the resulting semiconductor structure, as desired. Additionally, III-N layer 202 may also be non-linear as shown in FIG. 5B'. The c-axis and m-plane of the III-N material are both illustrated in FIG. 5B'. As can be seen, the c-axis and the m-plane of the crystal structure are not positioned exactly horizontally. In these and other embodiments, the m-plane of the III-N layer may be positioned approximately horizontally or may be within 5°, 10°, 15°, 20°, or 30° from horizontal. Numerous configurations and variations will be apparent in light of this disclosure.

Figure 5C:
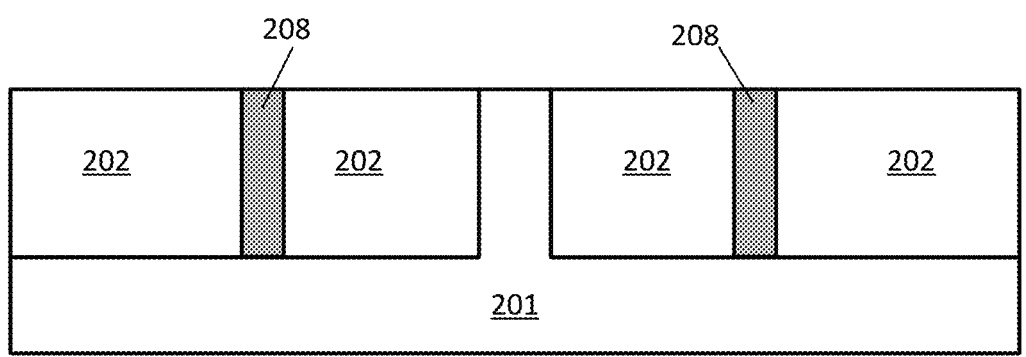

Method 300 of FIG. 3 continues with depositing 306 a second III-N layer 208 to form a structure as shown in FIG. 5C, in accordance with an example embodiment. The material used to form second III-N layer 208 may be a III-N material that is different from the III-N material used to implement III-N layer 202. For example, in some embodiments, GaN may be used to implement III-N layer 202 and InGaN may be used to form second III-N layer 208. In embodiments where second III-N layer 208 is implemented with InGaN, the indium content of second III-N layer 208 may be within the range of 1% to 30%. For example, the indium concentration of second III-N layer 208 may be between 5-10% in some particular embodiments. Second III-N layer 208 may have any desired width, including a width between 2 and 10 nm. As will be apparent in light of this disclosure, III-N layer 202 may be selectively recessed in regions to allow for appropriate placement of second III-N layer 208. Second III-N layer 208 may be formed by any suitable technique, including but not limited to deposition and/or epitaxial growth.

Although not illustrated in method 300 of FIG. 3, a polarization layer may optionally be formed on the structure shown in FIG. 5C, if desired, in accordance with some example embodiments. A polarization layer, if present, may have any thickness, such as less than 2 nm, or less than 1 nm, in some embodiments. If present, the polarization layer may be any material described with respect to the polarization layer 210 of method 100 of FIG. 2, such as aluminum nitride (AlN). An example III-N transistor 200b having a polarization layer 210 is provided in FIG. 1B.

Figure 5D:
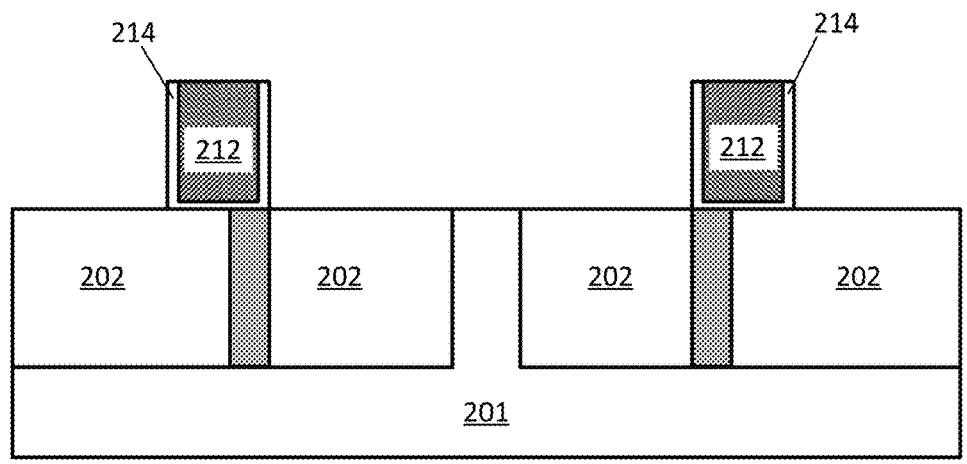

Method 300 of FIG. 3 continues with forming 308 a dummy gate stack to produce a structure as shown in FIG. 5D, in accordance with an example embodiment. In some embodiments, the dummy gate stack may include a dummy gate 212 and a dummy oxide 214, as shown in FIG. 5D. Dummy gate 212 and dummy oxide 214 may be implemented with any suitable materials, such as poly-silicon and/or $SiO_2$. Dummy gate 212 and/or dummy oxide 214 may be formed by any type of deposition techniques. As can be seen in FIG. 5D, dummy gate 212 and dummy oxide 214 may be deposited above a region that will serve as the channel. In some embodiments, dummy gate 212 and dummy oxide 214 may eventually be replaced with the gate stack. In some embodiments, the gate stack materials (e.g., gate electrode and/or dielectric layer) may be formed in approximately the same position as dummy gate 212 and dummy oxide 214.

Figure 5E:
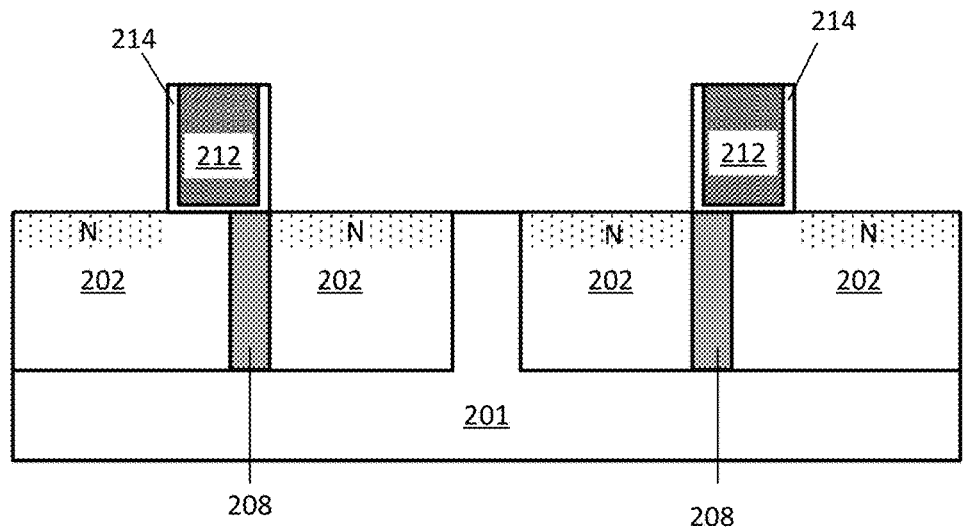

Method 300 of FIG. 3 continues with optionally doping at least a portion of III-N layer 202 to produce a structure as shown in FIG. 5E, in accordance with an example embodiment. If present, any appropriate type of dopant may be used to dope a portion of III-N layer 202, depending on desired application or end use. For example, in some particular embodiments, n-type silicon and/or germanium may be used to dope a region of III-N layer 202. As shown in FIG. 5E, regions of the III-N layer 202 that are not covered by the dummy gate stack may be doped in some embodiments. In some such embodiments, the dummy gate stack may act as a mask to shield the channel region from dopant. In some particular embodiments, regions of III-N layer 202 that connect the source and the drain to the channel region may be doped to form tips. For example, FIG. 5E shows an n-type silicon implant dopant that may be used to form n-doped tips in III-N layer 202 that connect the source to the channel and the drain to the channel. While FIGS. 5E-H illustrate III-N transistors 200b having n-doped regions (e.g., tips) connecting the channel to the source and drain, it will be understood that these regions may be more lightly or heavily doped in some embodiments, or in other embodiments may include 2DEG or other appropriate architecture. Numerous configurations will be apparent in light of this disclosure.

Figure 5F:
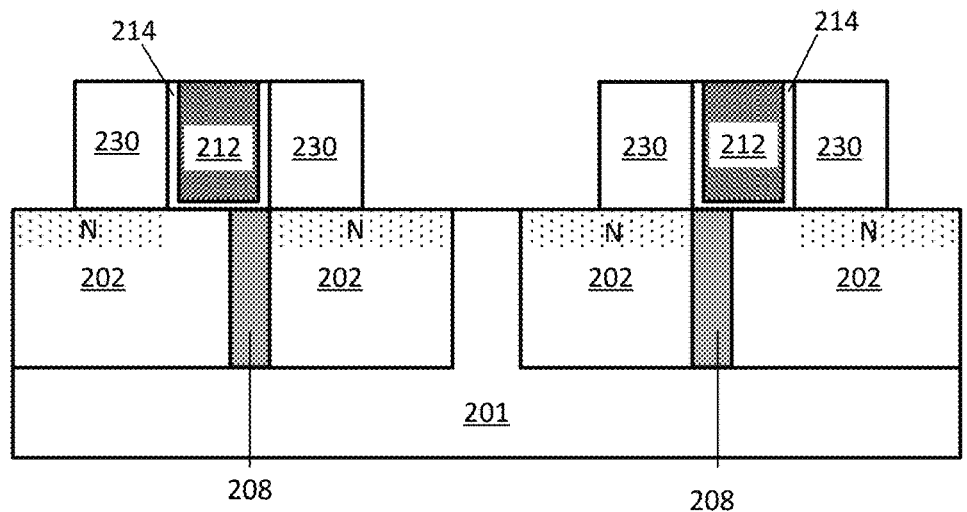

Method 300 of FIG. 3 continues with depositing 312 spacers 230 to form a structure as shown in FIG. 5F, in accordance with an example embodiment. As shown in FIG. 5F, spacers 230 may be formed on either side of the dummy gate stack (e.g., dummy gate 212 and dummy oxide 214). Spacers 230 may be formed of any suitable material, including, for example, silicon nitride or silicon dioxide, or any other suitable gate spacer material. Spacers 230 may be formed by any appropriate lithography technique. For example, in some embodiments, a blanket of spacer material may be deposited over the structure shown in FIG. 5E and excess spacer material may then be removed by etching. In some such embodiments, a directional etching process (e.g., a dry etching process) may be used to remove excess spacer material, resulting in the formation of spacers 230, as shown in FIG. 5F.

Figure 5G:
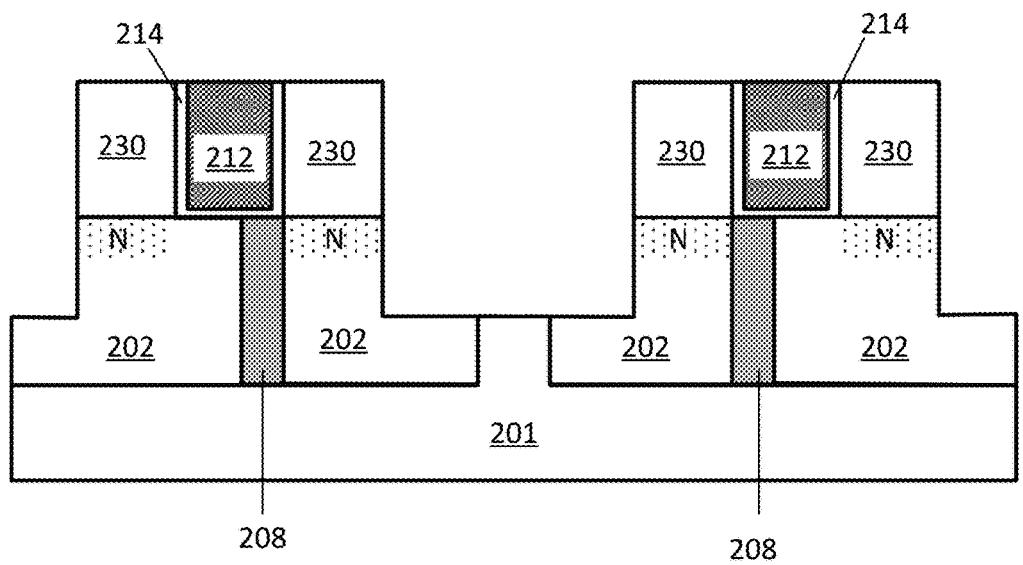

Method 300 of FIG. 3 continues with forming 314 source and drain (S/D) regions 220 to produce a structure as shown in FIG. 5G, in accordance with an example embodiment. In some embodiments, forming 314 S/D regions 220 may involve etching a portion of III-N layer 202 and/or substrate 201. In some particular embodiments, III-N layer 202 and substrate 201 may be etched concurrently, such as by a dry etch process. In some such embodiments, the dummy gate stack and spacers 230 may act as a mask and may not be affected by the dry etching process. Forming 314 S/D regions 220 may also involve, in some embodiments, depositing and/or growing S/D materials in one or more etched region(s) to form S/D regions 220. S/D regions 220 may be implemented with any material described in method 100 with respect to N+ source layer and N+ drain layer 220. For example, in some particular embodiments, S/D regions 220 may be formed of InGaN, such as N+ doped InGaN. Numerous configurations and alternatives will be apparent in light of this disclosure.

Figure 5H:
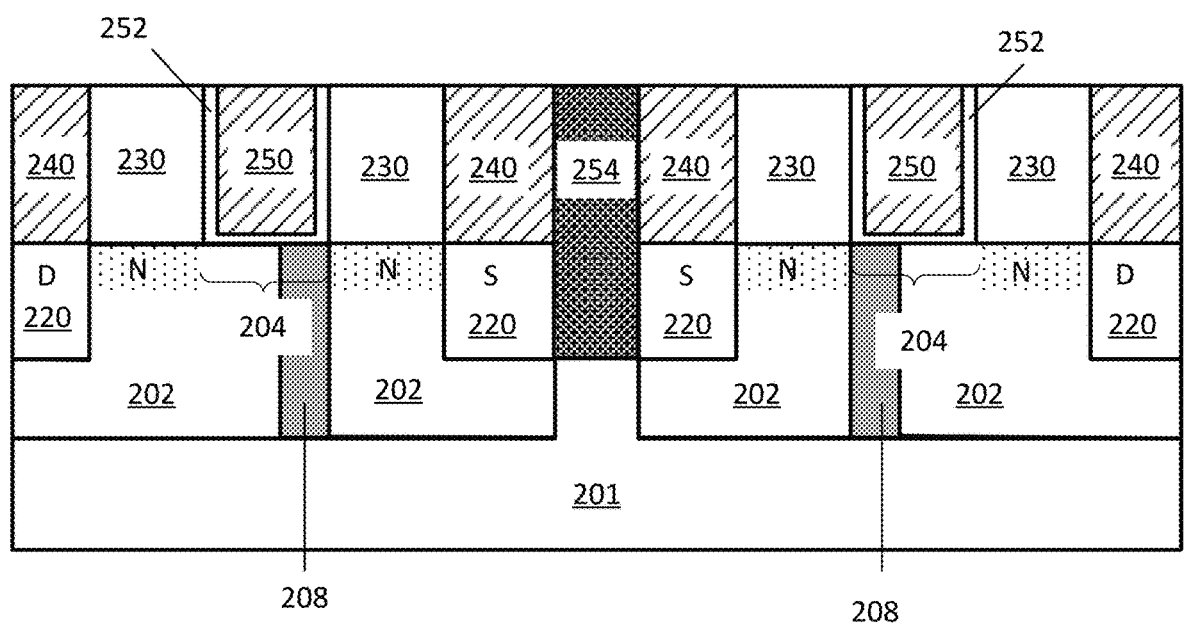

Method 300 of FIG. 3 continues with completing 316 formation of the III-N transistor(s) 200b to form a resulting structure as shown in FIG. 5H, in accordance with an example embodiment. Completing 316 formation of III-N transistor(s) 200b may include various processes, such as S/D metallization to form source and drain contacts 240 and/or replacement of the dummy gate stack with a gate stack (e.g., a gate electrode 250 and a dielectric layer 252), in accordance with some example embodiments. S/D contacts 240, gate dielectric 252, and gate electrode 250 may be formed using any suitable techniques (e.g., CVD, PVD) and from any suitable materials. S/D contacts, for example, may be any material described in method 100 regarding S/D contacts 240, such as tungsten, titanium, silver, gold, aluminum and alloys thereof. The gate dielectric 252 may be any suitable oxide, such as silicon dioxide, or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 252 to improve its quality when a high-k material is used. The gate electrode 250 may comprise a wide range of materials, such as polysilicon or various suitable metals or metal alloys, such as aluminum, tungsten, titanium, tantalum, copper, titanium nitride, or tantalum nitride, for example. As shown in FIG. 5H, a dielectric material 254 may be deposited in resulting trench regions, such as, for example, between adjacent S/D regions 220. Numerous configurations and alternatives will be apparent in light of this disclosure.

It will be understood that although as illustrated in FIG. 5H, the second III-N layer 208 does not extend beyond the gate stack, in some embodiments, the second III-N layer 208 may extend beyond the gate stack. For example, FIG. 1B shows an example III-N transistor 200b having a second III-N layer 208 that is positioned such that a portion is within the channel and a portion extends beyond the gate dielectric 252.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show the III-N transistor components (e.g., III-N transistors having a graded channel region).

Example System

Figure 6:
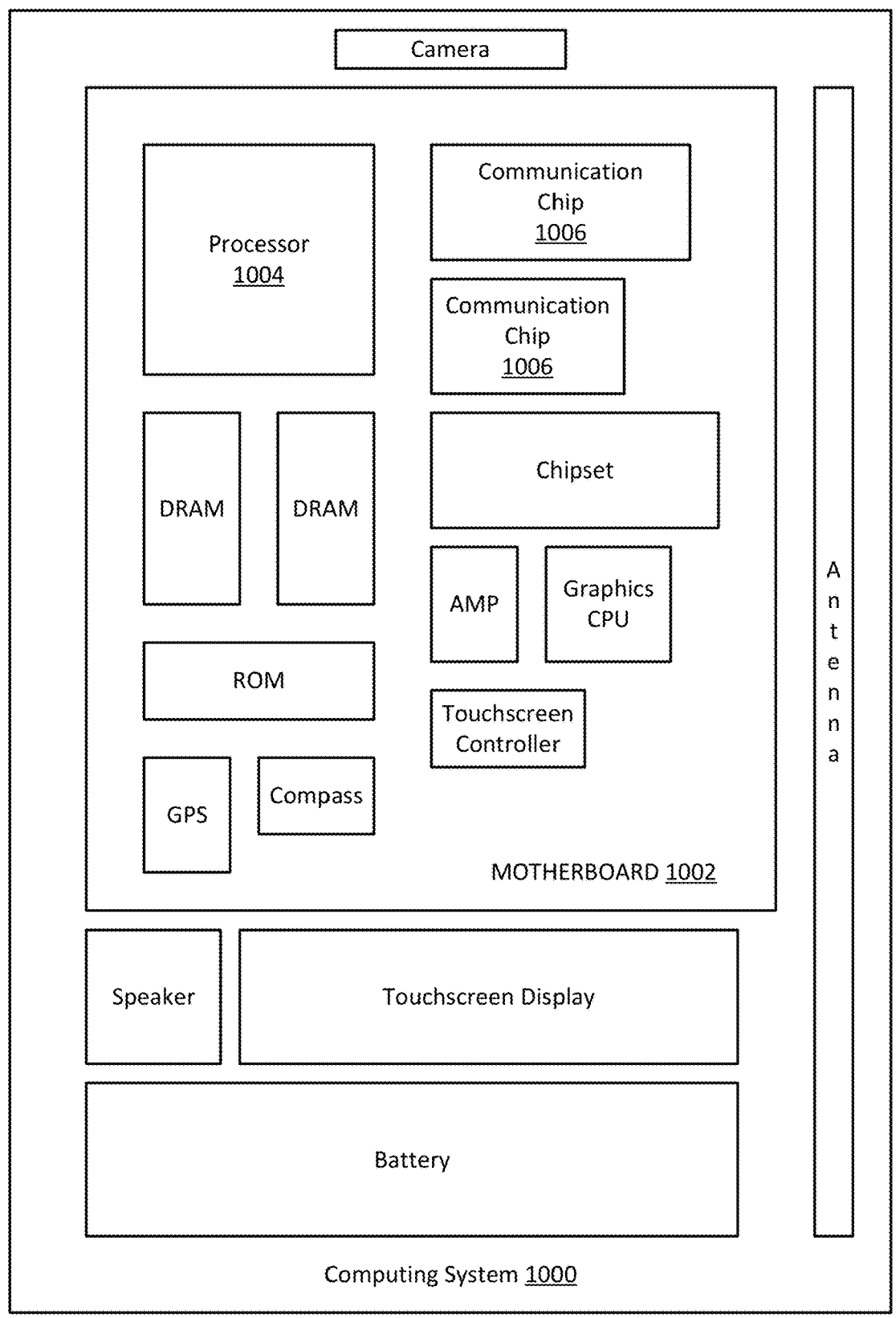
FIG. 6 illustrates an example computing system implemented with one or more integrated circuit structures or devices formed using the techniques disclosed herein, in accordance with various embodiments of the present disclosure.

FIG. 6 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, the communication chip 1006 is implemented with or otherwise includes III-N transistors having graded channel regions integrated therein.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., a III-N transistor having a graded channel region) formed using the disclosed techniques, as variously described herein. The term "processor" may refer to any device or portion of a device that processes, for instance, electronic data from registers and/or memory to transform that electronic data into other electronic data that may be stored in registers and/or memory. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a III-N transistor that includes: a semiconductor layer that includes a first III-N material; a gate above the semiconductor layer; a source region and a drain region located on the semiconductor layer and to respective sides of the gate; a channel region located in the semiconductor layer below the gate and between the source region and the drain region, wherein said channel region is graded and includes both the first III-N material and a second III-N material, the second III-N material being different than the first III-N material; and a gate structure located over the channel region.

Example 2 includes the subject matter of Example 1, wherein the channel region is graded along a length of the channel in at least one of a source-to-drain direction and a drain-to-source direction.

Example 3 includes the subject matter of any of Examples 1 and 2, wherein the first III-N material is gallium nitride (GaN) and the second III-N material is indium gallium nitride (InGaN).

Example 4 includes the subject matter of Example 3, wherein at a first point along the length of the channel, the concentration of indium is less than 1% and at a second point along the length of the channel, the concentration of indium is at least 5%.

Example 5 includes the subject matter of Example 4, wherein the concentration of indium at a point along the length of the channel is at least 10%.

Example 6 includes the subject matter of any of Examples 4 and 5, wherein the concentration of indium at a point along the length of the channel is at least 20%.

Example 7 includes the subject matter of any of Examples 4-6, wherein the first point along the length of the channel is closer to the source than the second point along the length of the channel.

Example 8 includes the subject matter of any of Examples 4-7, wherein the concentration of indium increases gradually from less than 1% to at least 5% along the length of the channel.

Example 9 includes the subject matter of any of Examples 3-8, wherein the GaN includes a crystal structure and the GaN is positioned to expose a c-plane of the crystal structure at a surface of the semiconductor layer comprising the first III-N material.

Example 10 includes the subject matter of any of Examples 3-9 and further includes two-dimensional electron gas (2DEG) regions extending between the source region and channel region and the drain region and the channel region.

Example 11 includes the subject matter of any of Examples 1-10 and further includes a polarization layer positioned over the semiconductor layer that includes the first III-N material.

Example 12 includes the subject matter of Example 11, wherein the polarization layer includes aluminum nitride.

Example 13 includes the subject matter of any of Examples 1-12, wherein the channel includes a first region that includes the first III-N material but not the second III-N material and a second region that includes the second III-N material but not the first III-N material.

Example 14 includes the subject matter of Example 13, wherein the first region consists essentially of GaN and the second region consists essentially of InGaN.

Example 15 includes the subject matter of Example 14, wherein the InGaN has an indium concentration of between 5 and 20%.

Example 16 includes the subject matter of Example 15, wherein the first region is closer to the source than the second region.

Example 17 includes the subject matter of any of Examples 15 and 16, wherein the GaN includes a crystal structure and the GaN is positioned to expose an m-plane of the crystal structure at a surface of the semiconductor layer comprising the first III-N material.

Example 18 includes the subject matter of any of Examples 13-17 and further includes n-doped silicon tips extending between the source region and channel region and the drain region and the channel region.

Example 19 includes the subject matter of any of Examples 1-18 and further includes a polarization layer positioned over the semiconductor layer comprising the first III-N material.

Example 20 includes the subject matter of Example 19, wherein the polarization layer that includes aluminum nitride.

Example 21 includes the subject matter of any of Examples 1-20, wherein the channel has a length of 5-30 nm.

Example 22 includes the subject matter of any of Examples 1-20, wherein the III-N transistor includes at least one of the following geometries: high-electron-mobility transistor (HEMT) architecture, pseudomorphic HEMT (pHEMT) architecture, two-dimensional electron gas (2DEG) architecture, three-dimensional electron gas (3DEG) architecture, multiple quantum-well (MQW) architecture, or super-lattice architecture.

Example 23 is a computing system that includes the subject matter of any of Examples 1-22.

Example 24 is a system-on-chip comprising the subject matter of any of Examples 1-20.

Example 25 is a method of forming a III-N transistor, the method involving: forming a semiconductor layer that includes a first III-N material; forming a gate above the semiconductor layer; forming a drain region in the semiconductor layer next to a first side of the gate; forming a source region in the semiconductor layer next to a second side of the gate; and forming a graded channel region in the semiconductor layer below the gate and between the source region and the drain region, wherein the graded channel region includes both the first III-N material and a second III-N material and the first III-N material is different from the second III-N material.

Example 26 includes the subject matter of Example 25, wherein forming the semiconductor layer includes growing gallium nitride (GaN) to expose a c-plane of the GaN at a top surface of the semiconductor layer that includes the III-N material.

Example 27 includes the subject matter of any of Examples 25 and 26 and further includes recessing at least a portion of the drain region to expose both a top surface and a sidewall of the drain region.

Example 28 includes the subject matter of Example 27, wherein forming the graded channel region occurs by epitaxially growing a graded III-N layer on the top surface and the sidewall of the drain region.

Example 29 includes the subject matter of any of Examples 25-28, wherein forming the graded channel region occurs prior to forming the source region.

Example 30 includes the subject matter of any of Examples 28 and 29, wherein the graded III-N layer is formed by epitaxially growing the first III-N material on at least one exposed surface of the drain region, then introducing a high concentration of the second III-N material and then gradually reducing the concentration of the second III-N material introduced until only the first III-N material is used for growth.

Example 31 includes the subject matter of Example 30, wherein the first III-N material is gallium nitride (GaN) and the second III-N material is indium gallium nitride (InGaN).

Example 32 includes the subject matter of any of Examples 28-31 and further includes polishing the graded III-N layer to reveal the graded channel region.

Example 33 includes the subject matter of Example 32 and further includes depositing a polarization layer over the graded channel region.

Example 34 includes the subject matter of Example 33, wherein the polarization layer includes aluminum nitride.

Example 35 is a method of forming a III-N transistor, the method including: forming a fin in a silicon substrate; forming a semiconductor layer that includes a first III-N material on the silicon substrate; forming a region that includes a second III-N material in the semiconductor layer, the second III-N material being different from the first III-N material; forming a drain region in the semiconductor layer; forming a source region in the semiconductor layer; and forming a gate above the semiconductor layer.

Example 36 includes the subject matter of Example 35, wherein forming the semiconductor layer that includes the first III-N material involves growing gallium nitride (GaN) from a sidewall of the fin in the silicon substrate to expose an m-plane of the GaN on a top surface of the semiconductor layer that includes the first III-N material.

Example 37 includes the subject matter of any of Examples 35 and 36, wherein the first III-N material is GaN and the second III-N material is indium gallium nitride (InGaN).

Example 38 includes the subject matter of any of Examples 35-37, wherein the region underneath the gate in the semiconductor layer is a graded channel region that is graded along a length of the channel in at least one of a source-to-drain direction and a drain-to-source direction.

Example 39 includes the subject matter of Example 38 and further includes doping a portion of the semiconductor layer between the source region and the graded channel region and doping a portion of the semiconductor layer between the drain region and the graded channel region.

Example 40 includes the subject matter of Example 39, wherein doping is performed using an n-type dopant.

Example 41 includes the subject matter of any of Examples 39 and 40 and further includes depositing a dummy gate stack over the semiconductor layer that includes the first III-N material prior to doping.

Example 42 includes the subject matter of Example 41 and further includes replacing the dummy gate stack with the gate and a gate dielectric layer positioned between the graded channel region and the gate.

Example 43 includes the subject matter of any of Examples 38-42, wherein the graded channel region includes a first region consisting essentially of GaN and a second region consisting essentially of InGaN.

Example 44 includes the subject matter of Example 43, wherein the InGaN includes between 5% and 20% indium.

Example 45 includes the subject matter of any of Examples 43 and 44, wherein the second region is closer to the source than the first region.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a layer comprising a first III-N material;
   a gate structure above the layer;
   a source region and a drain region located on the layer and to respective sides of the gate structure; and
   a semiconductor region located in the layer between the source region and the drain region, wherein said semiconductor region includes a graded portion, a first non-graded portion adjacent to the graded portion between the graded portion and the source region, and a second non-graded portion adjacent to the graded portion between the graded portion and the drain region, wherein the first non-graded portion and the second non-graded portion are the same material, and wherein the graded portion comprises both the first III-N material and a second III-N material, the second III-N material being compositionally different than the first III-N material.

2. The integrated circuit of claim 1, wherein the graded portion of the semiconductor region is graded along a length of the channel region in one or both of a source-to-drain direction and a drain-to-source direction.

3. The integrated circuit of claim 2, wherein the first III-N material is gallium nitride (GaN) and the second III-N material is indium gallium nitride (InGaN).

4. The integrated circuit of claim 3, wherein the GaN includes a crystal structure and the GaN is positioned to expose a c-plane of the crystal structure at a surface of the layer comprising the first III-N material.

5. The integrated circuit of claim 3, wherein at a first point along the length of the semiconductor region, the concentration of indium is less than 1% and at a second point along the length of the semiconductor region, the concentration of indium is at least 5%.

6. The integrated circuit of claim 5, wherein the concentration of indium at a third point along the length of the semiconductor region is at least 20%.

7. The integrated circuit of claim 5, wherein the concentration of indium increases gradually from less than 1% to at least 5% along the length of the semiconductor region.

8. A computing system comprising the integrated circuit of claim 1.

9. The integrated circuit of claim 1, wherein the first non-graded portion and the second non-graded portion of the semiconductor region comprises the first III-N material.

10. The integrated circuit of claim 9, wherein the first III-N material is gallium nitride (GaN).

11. The integrated circuit of claim 1, further comprising a polarization layer over the semiconductor layer and between the source and drain regions.

12. The integrated circuit of claim 11, wherein the polarization layer comprises aluminum and nitrogen.

13. A method of forming a III-N transistor, the method comprising:
    forming a semiconductor layer comprising a first III-N material;
    forming a gate structure above the semiconductor layer;
    forming a drain region in the semiconductor layer next to a first side of the gate structure;

forming a source region in the semiconductor layer next to a second side of the gate structure;

recessing at least a portion of the drain region to expose both a top surface and a sidewall of the drain region; and forming a graded channel region in the semiconductor layer, the graded channel region comprising both the first III-N material and a second III-N material, the first III-N material being compositionally different from the second III-N material;

wherein in the formed III-N transistor, the graded channel region in the semiconductor layer is below the gate structure and between the source region and the drain region.

14. The method of claim 13, further comprising forming an oxide material beneath the semiconductor layer.

15. The method of claim 13, wherein forming the graded channel region occurs by epitaxially growing a graded III-N layer on the top surface and the sidewall of the drain region.

16. The method of claim 15, wherein the graded III-N layer is formed by epitaxially growing the first III-N material on at least one exposed surface of the drain region, then introducing a concentration of the second III-N material and gradually reducing the concentration of the second III-N material introduced until only the first III-N material is used for growth.

17. The method of claim 16, wherein the first III-N material is gallium nitride (GaN) and the second III-N material is indium gallium nitride (InGaN).

18. The method of claim 17 further comprising polishing the graded III-N layer to reveal the graded channel region.

19. A method of forming a III-N transistor, the method comprising:

forming a fin comprising silicon;

forming a semiconductor layer comprising a first III-N material, wherein the first III-N material comprising gallium and nitrogen, and forming the semiconductor layer includes growing gallium nitride (GaN) from a sidewall of the fin to expose an m-plane of the GaN on a top surface of the semiconductor layer;

forming a region comprising a second III-N material in the semiconductor layer, the second III-N material being compositionally different from the first III-N material;

forming a drain region;

forming a source region; and forming a gate structure.

20. The method of claim 19, wherein the first III-N material is GaN and the second III-N material is indium gallium nitride (InGaN).

* * * * *